United States Patent
Bruzda et al.

(10) Patent No.: US 11,955,438 B2
(45) Date of Patent: Apr. 9, 2024

(54) THERMALLY-CONDUCTIVE ELECTROMAGNETIC INTERFERENCE (EMI) ABSORBERS

(71) Applicant: Laird Technologies, Inc., Chesterfield, MO (US)

(72) Inventors: Karen Bruzda, Cleveland, OH (US); John David Ryan, Cleveland, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 414 days.

(21) Appl. No.: 17/481,426

(22) Filed: Sep. 22, 2021

(65) Prior Publication Data

US 2022/0093525 A1 Mar. 24, 2022

Related U.S. Application Data

(60) Provisional application No. 63/242,650, filed on Sep. 10, 2021, provisional application No. 63/082,142, filed on Sep. 23, 2020.

(51) Int. Cl.
| | |
|---|---|
| *H01L 23/552* | (2006.01) |
| *C08K 3/22* | (2006.01) |
| *C08K 3/34* | (2006.01) |
| *C08L 25/08* | (2006.01) |
| *H05K 9/00* | (2006.01) |

(52) U.S. Cl.
CPC ............ *H01L 23/552* (2013.01); *C08K 3/22* (2013.01); *C08K 3/34* (2013.01); *C08L 25/08* (2013.01); *H05K 9/003* (2013.01); *H05K 9/0081* (2013.01); *C08K 2003/2227* (2013.01); *C08L 2203/20* (2013.01)

(58) Field of Classification Search
CPC .. C08K 3/22; C08K 3/34; C08L 25/08; H05K 9/003; H05K 9/0081; H05K 7/20481; H05K 7/2039; H01L 23/552–556; H01L 27/0248–0296; H01L 23/373
See application file for complete search history.

(56) References Cited

U.S. PATENT DOCUMENTS

| | | | |
|---|---|---|---|
| 5,241,453 | A | 8/1993 | Bright et al. |
| 6,284,363 | B1 | 9/2001 | Maeda et al. |

(Continued)

FOREIGN PATENT DOCUMENTS

| | | |
|---|---|---|
| EP | 3546509 A1 | 10/2019 |
| EP | 3817535 A1 | 5/2021 |

(Continued)

OTHER PUBLICATIONS

CoolZorb Ultra Peeling and Handling Application Note; Laird, Feb. 9, 2021; one page.

(Continued)

*Primary Examiner* — Shahed Ahmed
(74) *Attorney, Agent, or Firm* — Anthony G. Fussner; Harness, Dickey & Pierce, P.L.C.

(57) ABSTRACT

Disclosed are exemplary embodiments of thermally-conductive electromagnetic interference (EMI) absorbers. In exemplary embodiments, the thermally-conductive EMI absorber may have a thermal conductivity of at least 6 Watts per meter per Kelvin (W/mK) and an attenuation greater than 15 decibels per centimeter (dB/cm) at a frequency of 10 gigahertz (GHz) or higher.

23 Claims, 7 Drawing Sheets

(56) References Cited

U.S. PATENT DOCUMENTS

| | | |
|---|---|---|
| 6,514,428 B2 | 2/2003 | Suzuki et al. |
| 6,962,753 B1 | 11/2005 | Yoshida |
| 7,094,822 B2 | 8/2006 | Sagal et al. |
| 7,417,078 B2 | 8/2008 | Fujiki et al. |
| 7,550,097 B2 | 6/2009 | Tonapi et al. |
| 7,589,147 B2 | 9/2009 | Kawata et al. |
| 9,260,645 B2 | 2/2016 | Bruzda |
| 9,611,414 B2 | 4/2017 | Timmerman et al. |
| 10,648,750 B2 | 5/2020 | Esseghir et al. |
| 10,892,204 B2 | 1/2021 | Kumura et al. |
| 11,229,147 B2 | 1/2022 | Do et al. |
| 2002/0158332 A1 | 10/2002 | Masayuki |
| 2004/0054029 A1 | 3/2004 | Fujiki et al. |
| 2008/0012103 A1 | 1/2008 | Foster et al. |
| 2016/0046791 A1 | 2/2016 | Tien et al. |
| 2016/0160104 A1* | 6/2016 | Bruzda ............... H01L 23/4275 252/74 |
| 2016/0233173 A1* | 8/2016 | Do ........................ C09K 5/14 |
| 2016/0234981 A1 | 8/2016 | Do et al. |
| 2017/0227304 A1 | 8/2017 | Esseghir et al. |
| 2018/0228063 A1 | 8/2018 | Dixon et al. |
| 2019/0023962 A1 | 1/2019 | Bruzda et al. |
| 2019/0229035 A1 | 7/2019 | Strader et al. |
| 2019/0375939 A1 | 12/2019 | Wei et al. |
| 2022/0093525 A1 | 3/2022 | Bruzda et al. |
| 2022/0267563 A1 | 8/2022 | Mezzanotti et al. |

FOREIGN PATENT DOCUMENTS

| | | |
|---|---|---|
| JP | 4070714 B2 | 4/2008 |
| JP | 4280200 B2 | 6/2009 |
| JP | 2019085452 A | 6/2019 |
| JP | 2019085482 A | 6/2019 |
| KR | 10-2017-0044675 A | 4/2017 |
| TW | 202108674 A | 3/2021 |
| WO | WO-2019046154 A1 | 3/2019 |

OTHER PUBLICATIONS

Hybrid Thermal/EMI Absorber CoolZorb-Ultra; www.lairdtech.com; Jan. 27, 2021, 3 pages.

Extended European Search Report dated Feb. 11, 2022 for European Patent Application (which claims priority to the same 2 U.S. provisional applications as the instant application); 12 pages.

South Korean Office Action for KR10-2021-0123043 that claims priority to the instant application; dated Nov. 17, 2022; 4 pages.

* cited by examiner

THERMALLY-CONDUCTIVE ELECTROMAGNETIC INTERFERENCE (EMI) ABSORBERS

CROSS-REFERENCE TO RELATED APPLICATIONS

This application claims the benefit of and priority to U.S. Provisional Patent Application No. 63/082,142 filed Sep. 23, 2020 and to U.S. Provisional Patent Application No. 63/242,650 filed Sep. 10, 2021. The entire disclosures of the above provisional applications are incorporated herein by reference.

FIELD

The present disclosure relates to thermally-conductive EMI absorbers.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and is not intended to limit the scope of the present disclosure.

FIG. 1 also shows a conventional thermal pad positioned between a heat sink and the board level shield.

DETAILED DESCRIPTION

Example embodiments will now be described more fully with reference to the accompanying drawings.

As recognized herein, there is a need for materials that are both highly thermally conductive and efficiently microwave absorbing such that a single material may be used instead of two separate materials in applications that have both thermal and stray radiation issues. For example, it is not uncommon to use two different interface materials for different functions within applications, such as one material optimized for thermally-conductive properties and another material optimized for absorbing properties. Also recognized herein is the need for higher thermal conductivity (e.g., greater than 6 W/mK, etc.) to meet increasing thermal dissipation demands without sacrificing absorbing properties.

Accordingly, disclosed herein are exemplary embodiments of thermally-conductive electromagnetic interference (EMI) absorbers having thermal conductivity greater than 6 W/mK (e.g., at least about 11 W/mK, at least about 11.5 W/mK, at least about 12 W/mK, etc.) and attenuation greater than 15 decibels per centimeter (dB/cm) at a frequency of 10 gigahertz (GHz) or higher, etc. Accordingly, disclosed herein are exemplary embodiments of thermally-conductive EMI absorbers that may be usable as a single interface material having both high thermal conductivity and efficient absorption. The thermally-conductive EMI absorbers are configured to have the combined performance of a thermal interface material and an EMI absorber.

A thermally-conductive EMI absorber disclosed herein may therefore be used to establish a thermally-conductive heat path having a high thermal conductivity (e.g., at least about 11 W/mK, etc.) between a heat source (e.g., an integrated circuit, etc.) and a heat dissipation/removal structure (e.g., a board level shield, heat sink, etc.) while also suppressing radiating electromagnetic fields, e.g., coupling between an integrated circuit and a heat sink, etc.

Figure 1:
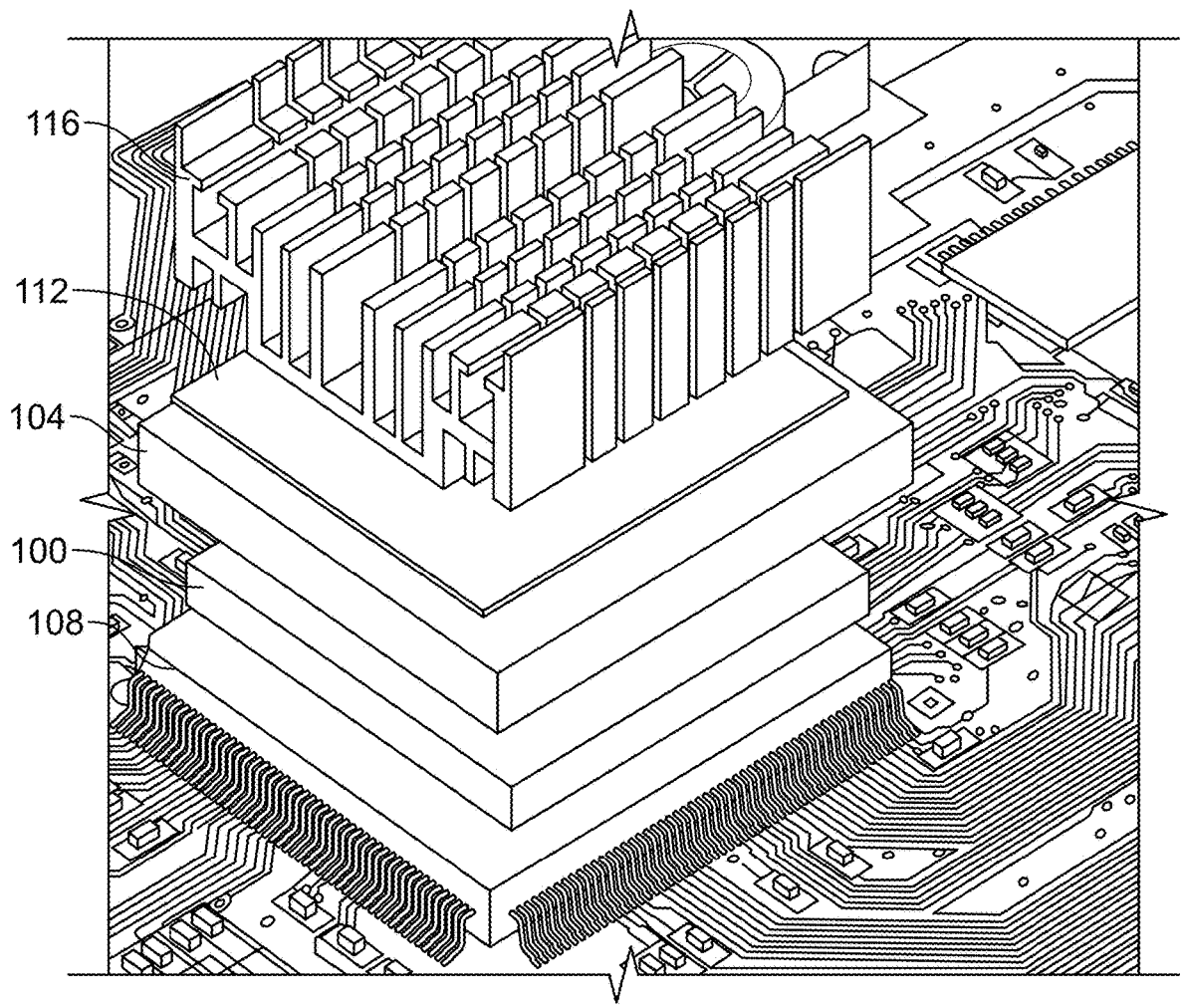
FIG. 1 illustrates an exemplary embodiment of a thermally-conductive EMI absorber positioned between a board level shield and an integrated circuit or chip.
Figure 2:
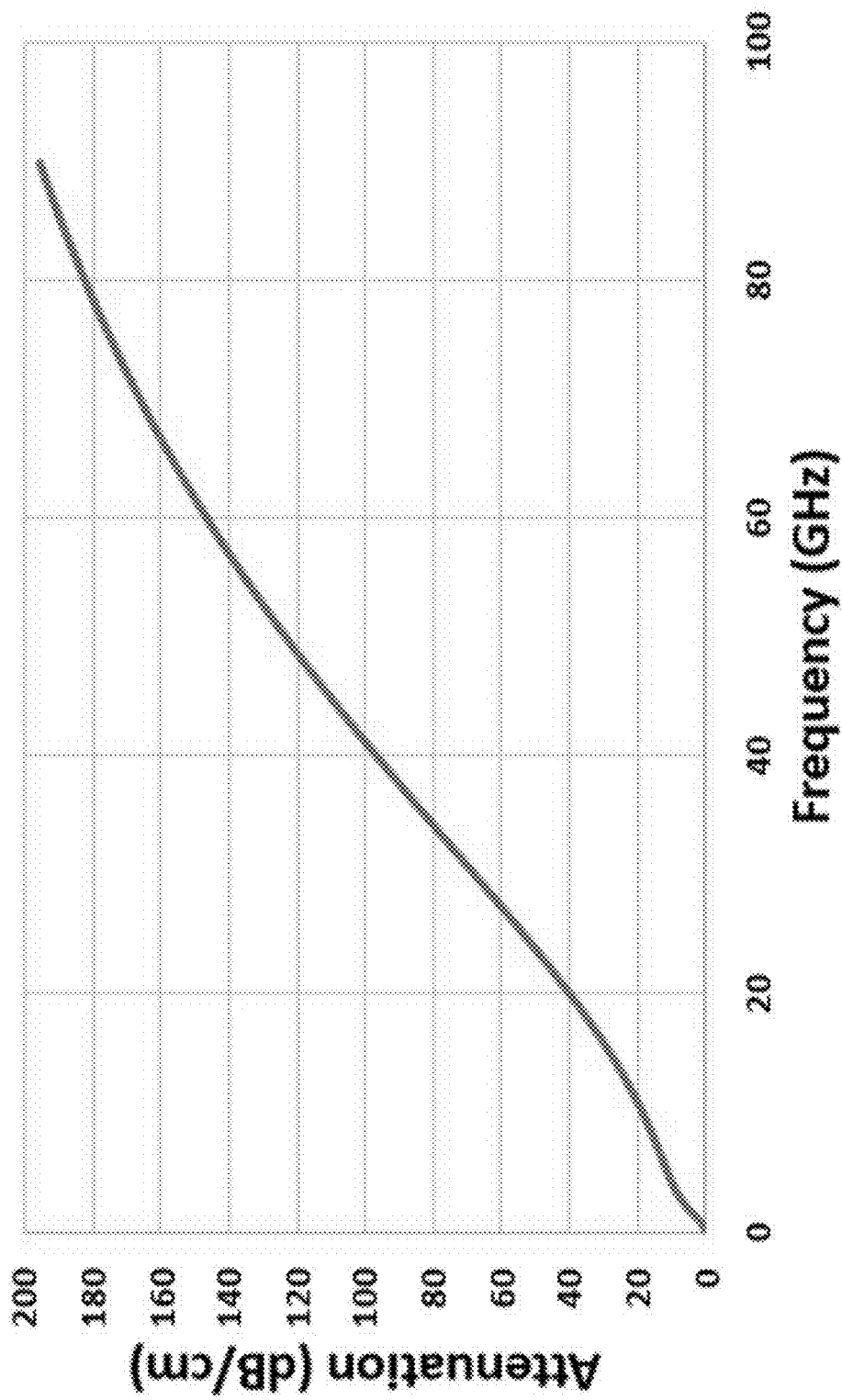
FIG. 2 is a line graph of attenuation in decibels per centimeter (dB/cm) versus frequency in gigahertz (GHz) for a thermally-conductive EMI absorber according to an exemplary embodiment.
Figure 3:
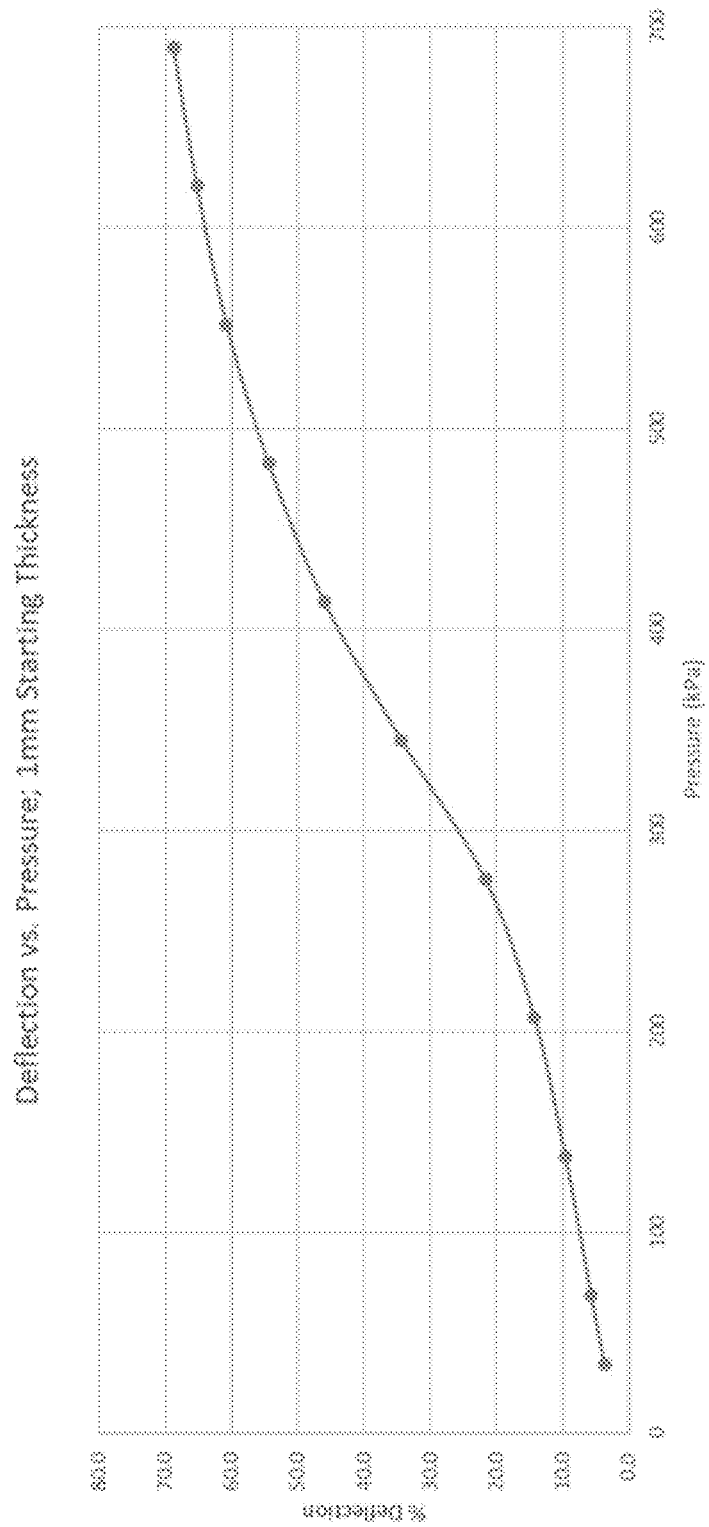
FIG. 3 is a line graph of deflection percent (%) versus pressure in kilopascals (kPa) for a thermally-conductive EMI absorber according to an exemplary embodiment, where the thermally-conductive EMI absorber had a starting thickness of 1 millimeter (mm).
Figure 4:
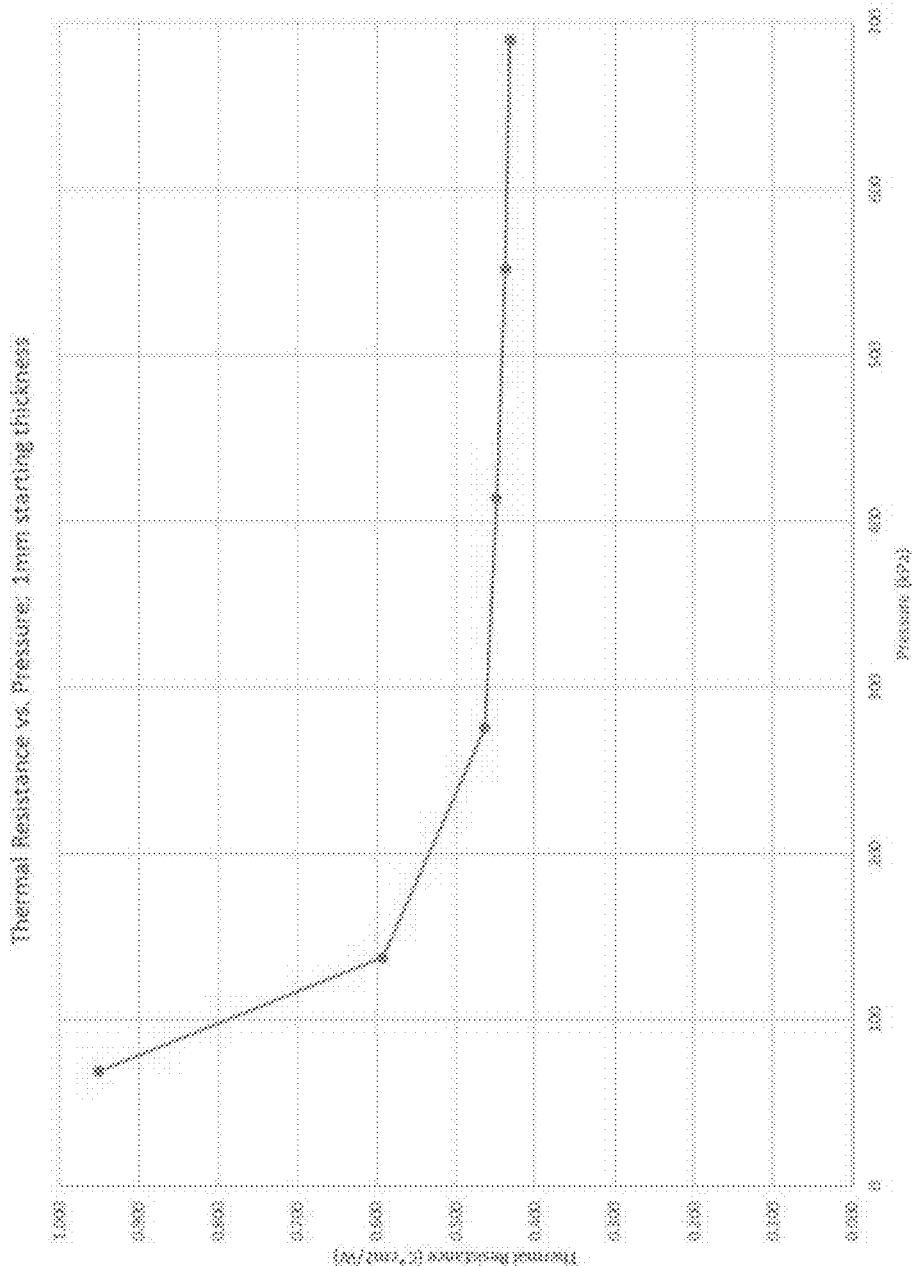
FIG. 4 is a line graph of thermal resistance in degrees Celsius per square cm/Watts ($C*cm^2/W$) versus pressure (kPa) for a thermally-conductive EMI absorber according to an exemplary embodiment, where the thermally-conductive EMI absorber had a starting thickness of 1 mm.
Figure 5:
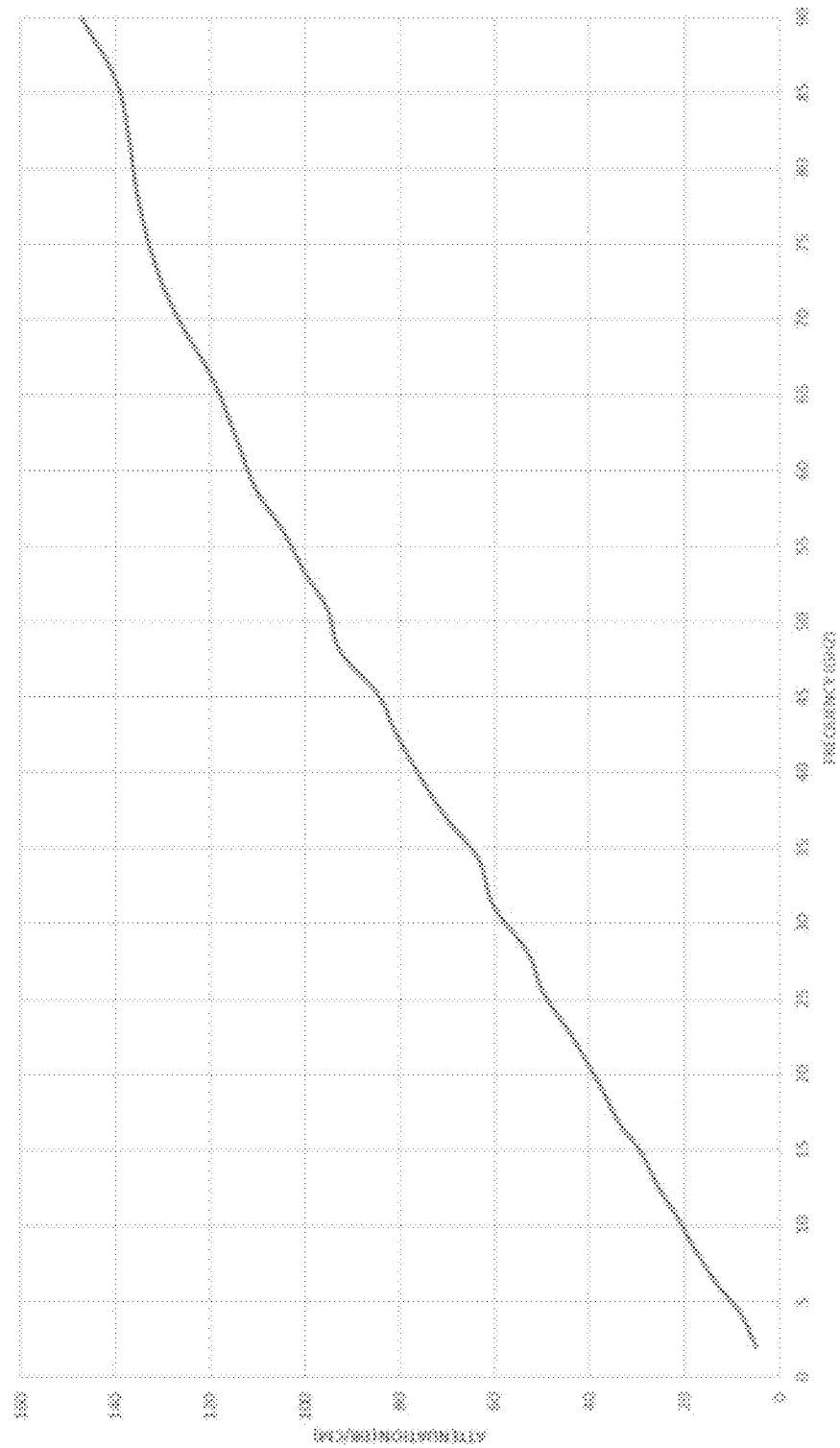
FIG. 5 is a line graph of attenuation in decibels (dB/cm) versus frequency (GHz) for an exemplary embodiment of a thermally-conductive EMI absorber.
Figure 6:
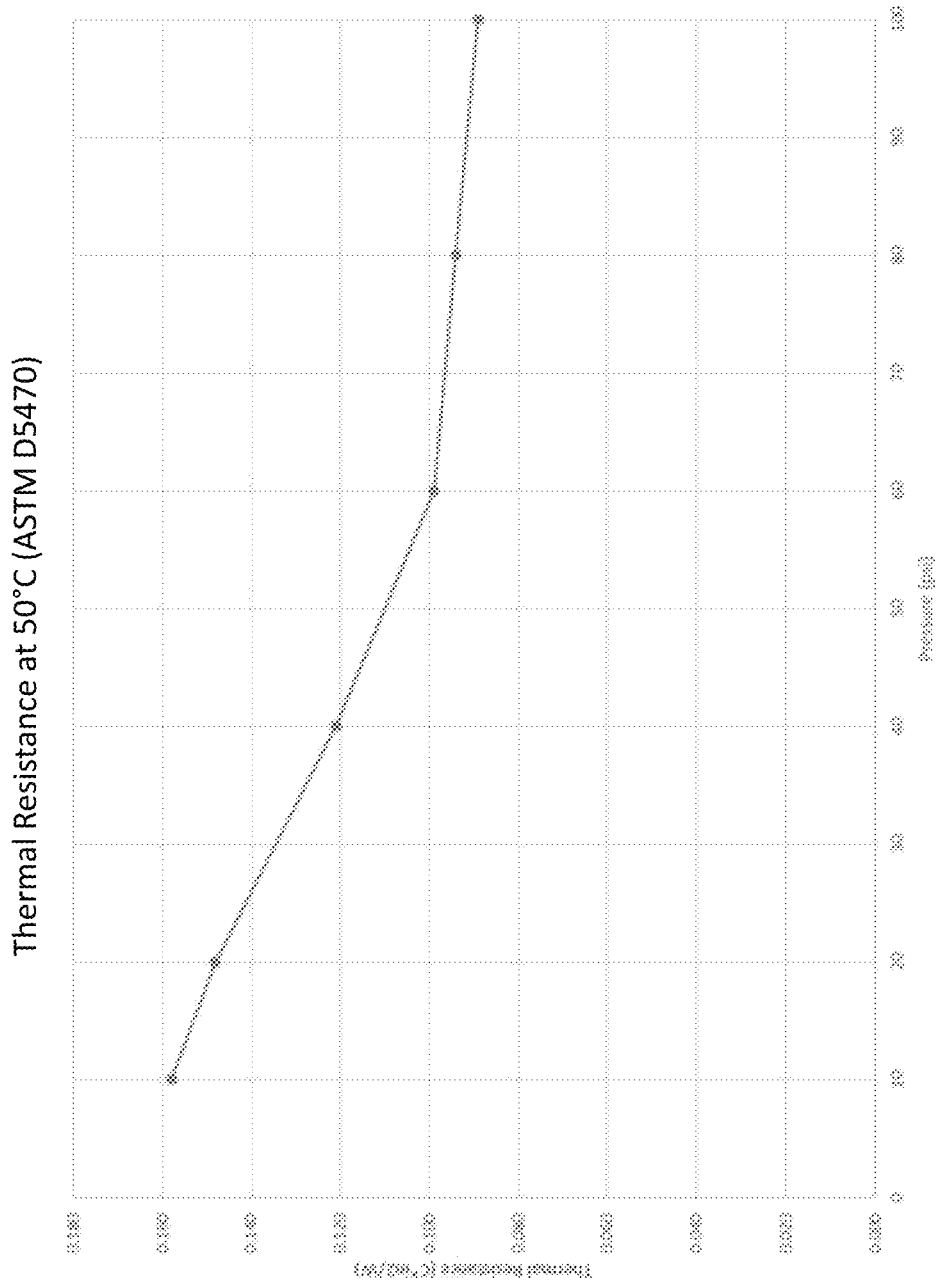
FIG. 6 is a line graph of thermal resistance ($C*cm^2/W$) versus pressure in pounds per square inch (psi) at 50° C. and according to ASTM D5470 for an exemplary embodiment of a thermally-conductive EMI absorber.
Figure 7:
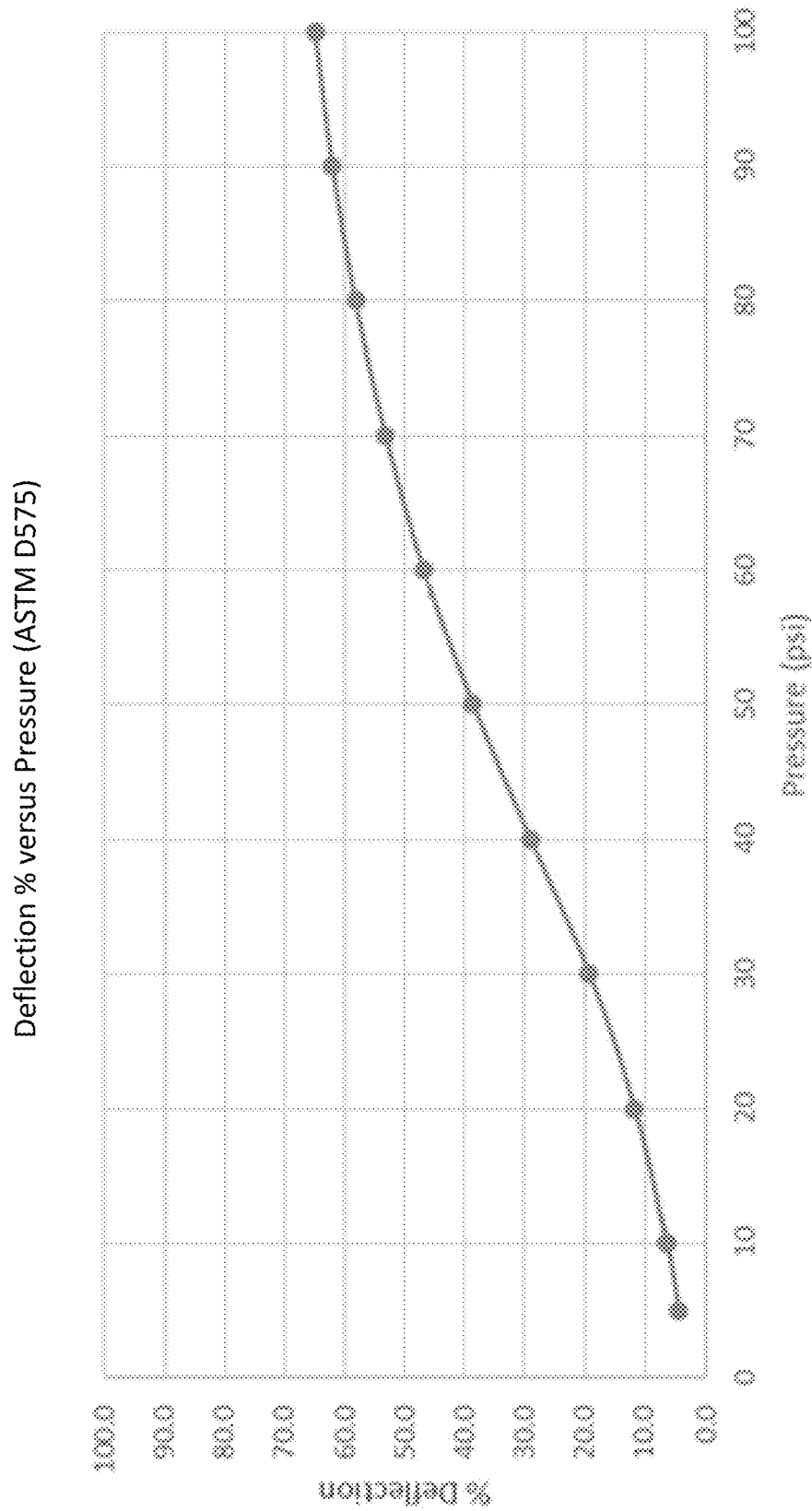
FIG. 7 is a line graph of deflection percent (%) versus pressure (psi) for a thermally-conductive EMI absorber according to an exemplary embodiment.

For example, FIG. 1 illustrates an exemplary embodiment of a thermally-conductive EMI absorber 100 positioned between a board level shield 104 and an integrated circuit or chip 108. FIG. 1 also shows a conventional thermal interface material 112 positioned between a heat sink 116 and the board level shield 104. In this illustrated embodiment of FIG. 1, the thermally-conductive EMI absorber 100 is operable as a thermal interface material for establishing a thermally-conductive heat path from the integrated circuit 108 to the board level shield 104. The thermally-conductive EMI absorber 100 is also operable as an EMI absorber for suppressing radiating electromagnetic fields coupling between the integrated circuit 108 and the heat sink 116. Accordingly, the thermally-conductive EMI absorber 100 may therefore provide the combined performance of a thermal interface material and an EMI absorber in a space-saving dual-purpose, single-product solution.

In exemplary embodiments, a thermally-conductive EMI absorber has a thermal conductivity of at least 6 W/mK (e.g., at least about 11 W/mK, at least about 11.5 W/mK, at least about 12 W/mK, etc.), an attenuation greater than 15 dB/cm at a frequency of 10 GHz or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. Continuing with this example, the thermally-conductive EMI absorber may comprise a silicone free gap filler pad that is initially provided in sheet form (e.g., 18 inch by 18 inch sheet, etc.) having a sheet thickness within a range from 0.5 mm to 5 mm. The thermally-conductive EMI absorber may be disposed between release liners as sheets or die cut parts. Alternatively, the thermally-conductive EMI absorber may be configured differently (e.g., have a different matrix system, etc.) such that the thermally-conductive EMI absorber comprises a phase change, grease, putty, or other non-pad form. The thermally-conductive EMI absorber may have one or more properties shown in Table 1 and/or Table 2 below.

In exemplary embodiments, a thermally-conductive EMI absorber comprises a matrix and at least one functional filler in the matrix. The thermally-conductive EMI absorber has a thermal conductivity greater than 6 W/mK and an attenuation greater than 15 decibels per centimeter (dB/cm) at a frequency of 10 gigahertz (GHz) or higher.

In some exemplary embodiments, the thermally-conductive EMI absorber has a thermal conductivity of at least 11 W/mK (e.g., 11 W/mK, 11.5 W/mK, 12 W/mK, higher than 12 W/mK, etc.). Also, the thermally-conductive EMI absorber has an attenuation greater than 15 dB/cm at a frequency of 10 GHz or higher, an attenuation greater than 34 dB/cm at a frequency of 20 GHz or higher, an attenuation greater than 66 dB/cm at a frequency of 40 GHz or higher, and/or an attenuation greater than 90 dB/cm at a frequency of 60 GHz or higher.

In some exemplary embodiments, the matrix comprises a thermally reversible oil gel, which includes process oil (e.g., paraffinic oil, etc.) and block copolymer. The block copolymer may include di-block copolymer (e.g., di-block styrenic copolymer, etc.) and/or tri-block copolymer (e.g., tri-block styrenic copolymer, etc.).

In some exemplary embodiments, the process oil and block copolymers are not chemically crosslinked such that the thermally-conductive EMI absorber is a thermally reversible thermoplastic material. For example, the matrix may comprises a thermoplastic silicone-free polymer oil gel resin.

In some exemplary embodiments, the matrix comprises a non-silicone polymer matrix, such as a non-silicone oil gel resin, etc. The non-silicone polymer matrix may comprise styrene and ethylene/butylene copolymers and/or styrene and ethylene/propylene copolymers. The thermally-conductive EMI absorber may be configured as a non-silicone gap filler pad, putty, grease, or phase change material that does not include silicone. In alternative embodiments, the thermally-conductive EMI absorber may include a silicone based matrix system.

In some exemplary embodiments, the matrix comprises paraffinic process oil, styrene-ethylene-propylene (SEP) linear polymer with a di-block structure, and coupling agent. In alternative exemplary embodiments, the matrix may include styrene-ethylene-butylene-styrene (SEBS) linear polymer with a tri-block structure in addition to, or as an alternative to, the styrene-ethylene-propylene (SEP) linear polymer with a di-block structure.

In some exemplary embodiments, the at least one functional filler within the matrix comprises one or more of zinc oxide, silicon carbide, carbonyl iron, aluminum oxide, aluminum nitride, aluminum, boron nitride, silicon nitride, iron, graphite, ferrite, alumina trihydrate, and/or silica. The thermally-conductive EMI absorber may include at least 90% by weight of the at least one functional filler and no more than 10% by weight of the matrix. The thermally-conductive EMI absorber may include at least 80% by volume of the at least one functional filler and no more than 20% by volume of the matrix. The at least one functional filler may include different grades (e.g., different sizes, different purities, different shapes, etc.) of the same (or different) functional fillers. For example, a thermally-conductive EMI absorber may include two or more (e.g., four, five, etc.) different grades (e.g., sizes, etc.) of silicon carbide. Other suitable fillers and/or additives may also be added to a thermally-conductive EMI absorber, such as pigments, plasticizers, process aids, flame retardants, extenders, tackifying agents, antioxidants, ultraviolet (UV) stabilizers, etc.

In some exemplary embodiments, the at least one functional filler includes (e.g., consists only of, etc.) carbonyl iron, silicon carbide, zinc oxide, aluminum nitride, and aluminum oxide. And, the matrix includes (e.g., consists only of, etc.) paraffinic process oil, styrene-ethylene-propylene (SEP) linear polymer with a di-block structure, and coupling agent. The matrix may further or alternatively include styrene-ethylene-butylene-styrene (SEBS) linear polymer with a tri-block structure. In these exemplary embodiments, the thermally-conductive EMI absorber includes at least 90% by weight of the at least one functional filler (carbonyl iron, silicon carbide, zinc oxide, aluminum nitride, and aluminum oxide) and no more than 10% by weight of the matrix. The thermally-conductive EMI absorber includes at least 80% by volume of the at least one functional filler (carbonyl iron, silicon carbide, zinc oxide, aluminum nitride, and aluminum oxide) and no more than 20% by volume of the matrix.

In other exemplary embodiments, the at least one functional filler includes (e.g., consists only of, etc.) zinc oxide, silicon carbide, and aluminum nitride. And, the matrix includes (e.g., consists only of, etc.) paraffinic process oil, styrene-ethylene-propylene (SEP) linear polymer with a di-block structure, and coupling agent. The matrix may further or alternatively include styrene-ethylene-butylene-styrene (SEBS) linear polymer with a tri-block structure. In these other exemplary embodiments, the thermally-conductive EMI absorber includes at least 90% by weight of the at least one functional filler (zinc oxide, silicon carbide, and aluminum nitride) and no more than 10% by weight of the matrix. The thermally-conductive EMI absorber includes at least 80% by volume of the at least one functional filler (zinc oxide, silicon carbide, and aluminum nitride) and no more than 20% by volume of the matrix.

In further exemplary embodiments, the at least one functional filler includes (e.g., consists only of, etc.) aluminum oxide and silicon carbide. And, the matrix includes (e.g., consists only of, etc.) process oil, di-block polymer, coupling agent, antioxidant, and silica. The matrix may further or alternatively include tri-block polymer. In these further exemplary embodiments, the thermally-conductive EMI absorber includes at least 90% by weight of the at least one functional filler (aluminum oxide and silicon carbide) and no more than 10% by weight of the matrix. The thermally-conductive EMI absorber includes at least 80% by volume of the at least one functional filler (aluminum oxide and silicon carbide) and no more than 20% by volume of the matrix.

In some exemplary embodiments, the thermally-conductive EMI absorber may have a hardness of about 68 Shore 00 or less at three seconds and a hardness of about 55 Shore 00 or less at thirty seconds. By way of example, the thermally-conductive EMI absorber may have a hardness of about 58 Shore 00 at three seconds and a hardness of about 37 Shore 00 or less at thirty seconds. Or, for example, the thermally-conductive EMI absorber may have a hardness of about 58 Shore 00 at three seconds and a hardness of about 31 Shore 00 or less at thirty seconds. The thermally-conductive EMI absorber is dielectric and not electrically conductive. The thermally-conductive EMI absorber does not include silicone, is silicone free (e.g., entirely silicone free, substantially silicone free, does not include detectable silicone, etc.), and/or is usable with no occurrence of silicone migration, whereby the thermally-conductive EMI absorber is suitable for silicone sensitive applications. In alternative embodiments, the thermally-conductive EMI absorber includes a silicone based matrix system.

The thermally-conductive EMI absorber may be configured as a gap filler pad, a phase change material, a putty, a grease, or a sheet material. For example, the thermally-conductive EMI absorber may comprise a thermoplastic pad configured to undergo physical crosslinking (not chemical crosslinking) as temperature is lowered from an elevated temperature to room temperature (e.g., about 20 degrees Celsius (° C.), etc.).

In another exemplary embodiment, a thermally-conductive EMI absorber comprises a matrix and at least one functional filler in the matrix. In this example, the at least one functional filler includes or consists essentially of zinc oxide, silicon carbide, and aluminum nitride. And, the matrix includes or consists essentially of paraffinic process oil, styrene-ethylene-propylene (SEP) linear polymer with a di-block structure, and coupling agent. Continuing with this example, the thermally-conductive EMI absorber includes at least 90% by weight (e.g., at least 93% by weight, etc.) of the at least one functional filler (zinc oxide, silicon carbide, aluminum nitride) and no more than 10% by weight (e.g., no more than 7% by weight, etc.) of the matrix. Also, the thermally-conductive EMI absorber includes at least 80% by volume (e.g., at least 81% by volume, etc.) of the at least one functional filler (zinc oxide, silicon carbide, aluminum nitride) and no more than 20% by volume (e.g., no more than 19% by volume, etc.) of the matrix. For example, the thermally-conductive EMI absorber may include about 1.5% to about 2% by weight of zinc oxide, about 16% to about 19% by weight of aluminum nitride, about 70% to about 80% by weight of silicon carbide, about 4% to about 6% by weight of paraffinic process oil, about 0.4% to about 0.8% by weight of styrene-ethylene-propylene (SEP) linear polymer with a di-block structure, and about 0.5% to about 1% by weight of coupling agent. The thermally-conductive EMI absorber has a thermal conductivity of at least 11 W/mK (e.g., 11 W/mK, 12 W/mK, higher than 12 W/mK, etc.). The thermally-conductive EMI absorber has an attenuation greater than 15 decibels per centimeter (dB/cm) at a frequency of 10 gigahertz (GHz) or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. The thermally-conductive EMI absorber has a hardness of about 68 Shore 00 or less at three seconds and a hardness of about 55 Shore 00 or less at thirty seconds. The thermally-conductive EMI absorber is dielectric and not electrically conductive. The thermally-conductive EMI absorber does not include silicone and is silicone free, such that the thermally-conductive EMI absorber is usable with no occurrence of silicone migration. The thermally-conductive EMI absorber is configured as a gap filler pad, a phase change material, a putty, a grease, or a sheet material.

In another exemplary embodiment, a thermally-conductive EMI absorber comprises a matrix and at least one functional filler in the matrix. In this example, the at least one functional filler includes or consists essentially of carbonyl iron, silicon carbide, zinc oxide, aluminum nitride, and aluminum oxide. And, the matrix includes or consists essentially of paraffinic process oil, styrene-ethylene-propylene (SEP) linear polymer with a di-block structure, and coupling agent. Continuing with this example, the thermally-conductive EMI absorber includes at least 90% by weight (e.g., at least 95% by weight, etc.) of the at least one functional filler (carbonyl iron, silicon carbide, zinc oxide, aluminum nitride, and aluminum oxide) and no more than 10% by weight (e.g., no more than 5% by weight, etc.) of the matrix. Also, the thermally-conductive EMI absorber includes at least 80% by volume (e.g., at least 83% by volume, etc.) of the at least one functional filler (carbonyl iron, silicon carbide, zinc oxide, aluminum nitride, and aluminum oxide) and no more than 20% by volume (e.g., no more than 17% by volume, etc.) of the matrix. For example, the thermally-conductive EMI absorber may include about 23% to about 29% by weight of carbonyl iron, about 0.8% to about 1.2% by weight of zinc oxide, about 5% to about 5.7% by weight of aluminum nitride, about 58% to about 67% by weight of silicon carbide, about 16% to about 21% by weight of aluminum oxide, about 3% to about 5% by weight of paraffinic process oil, about 0.3% to about 0.7% by weight of styrene-ethylene-propylene (SEP) linear polymer with a di-block structure, and about 0.4% to about 0.6% by weight of coupling agent. The thermally-conductive EMI absorber has a thermal conductivity of at least 11 W/mK (e.g., 11 W/mK, 12 W/mK, higher than 12 W/mK, etc.). The thermally-conductive EMI absorber has an attenuation greater than 15 decibels per centimeter (dB/cm) at a frequency of 10 gigahertz (GHz) or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. The thermally-conductive EMI absorber has a hardness of about 68 Shore 00 or less at three seconds and a hardness of about 55 Shore 00 or less at thirty seconds. The thermally-conductive EMI absorber is dielectric and not electrically conductive. The thermally-conductive EMI absorber does not include silicone and is silicone free, such that the thermally-conductive EMI absorber is usable with no occurrence of silicone migration. The thermally-conductive EMI absorber is configured as a gap filler pad, a phase change material, a putty, a grease, or a sheet material.

In another exemplary embodiment, a thermally-conductive EMI absorber comprises a matrix and at least one functional filler in the matrix. In this example, the at least one functional filler includes or consists essentially of zinc oxide, silicon carbide, and aluminum nitride. And, the matrix includes or consists essentially of paraffinic process oil, styrene-ethylene-butylene-styrene (SEBS) linear polymer with a tri-block structure, styrene-ethylene-propylene (SEP) linear polymer with a di-block structure, and coupling agent. Continuing with this example, the thermally-conductive EMI absorber includes at least 90% by weight (e.g., at least 93% by weight, etc.) of the at least one functional filler (zinc oxide, silicon carbide, aluminum nitride) and no more than 10% by weight (e.g., no more than 7% by weight, etc.) of the matrix. Also, the thermally-conductive EMI absorber includes at least 80% by volume (e.g., at least 81% by volume, etc.) of the at least one functional filler (zinc oxide, silicon carbide, aluminum nitride) and no more than 20% by volume (e.g., no more than 19% by volume, etc.) of the matrix. For example, the thermally-conductive EMI absorber may include about 1.5% to about 2% by weight of zinc oxide, about 16% to about 19% by weight of aluminum nitride, about 70% to about 80% by weight of silicon carbide, about 4% to about 6% by weight of paraffinic process oil, about 0.2% to 0.4% by weight of styrene-ethylene-butylene-styrene (SEBS) linear polymer with a tri-block structure, about 0.2% to about 0.4% by weight of styrene-ethylene-propylene (SEP) linear polymer with a di-block structure, and about 0.5% to about 1% by weight of coupling agent. The thermally-conductive EMI absorber has a thermal conductivity of at least 11 W/mK (e.g., 11 W/mK, 12 W/mK, higher than 12 W/mK, etc.). The thermally-conductive EMI absorber has an attenuation greater than 15 decibels per centimeter (dB/cm) at a frequency of 10 gigahertz (GHz) or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. The thermally-conductive EMI absorber has a hardness of about 68 Shore 00 or less at three seconds and a hardness of about 55 Shore 00 or less at thirty seconds. The thermally-conductive EMI absorber is dielectric and not electrically conductive. The thermally-conductive EMI absorber does not include silicone and is silicone free, such that the thermally-conductive EMI absorber is usable with no occurrence of silicone migration. The thermally-conductive EMI absorber is configured as a gap filler pad, a phase change material, a putty, a grease, or a sheet material.

In another exemplary embodiment, a thermally-conductive EMI absorber comprises a matrix and at least one functional filler in the matrix. In this example, the at least one functional filler includes or consists essentially of carbonyl iron, silicon carbide, zinc oxide, aluminum nitride, and aluminum oxide. And, the matrix includes or consists essentially of paraffinic process oil, styrene-ethylene-butylene-styrene (SEBS) linear polymer with a tri-block structure, styrene-ethylene-propylene (SEP) linear polymer with a di-block structure, and coupling agent. Continuing with this example, the thermally-conductive EMI absorber includes at least 90% by weight (e.g., at least 95% by weight, etc.) of the at least one functional filler (carbonyl iron, silicon carbide, zinc oxide, aluminum nitride, and aluminum oxide) and no more than 10% by weight (e.g., no more than 5% by weight, etc.) of the matrix. Also, the thermally-conductive EMI absorber includes at least 80% by volume (e.g., at least 83% by volume, etc.) of the at least one functional filler (carbonyl iron, silicon carbide, zinc oxide, aluminum nitride, and aluminum oxide) and no more than 20% by volume (e.g., no more than 17% by volume, etc.) of the matrix. For example, the thermally-conductive EMI absorber may include about 23% to about 29% by weight of carbonyl iron, about 0.8% to about 1.2% by weight of zinc oxide, about 5% to about 5.7% by weight of aluminum nitride, about 58% to about 67% by weight of silicon carbide, about 16% to about 21% by weight of aluminum oxide, about 3% to about 5% by weight of paraffinic process oil, about 0.2% to about 0.4% by weight of styrene-ethylene-butylene-styrene (SEBS) linear polymer with a tri-block structure, about 0.1% to about 0.3% by weight of styrene-ethylene-propylene (SEP) linear polymer with a di-block structure, and about 0.4% to about 0.6% by weight of coupling agent. The thermally-conductive EMI absorber has a thermal conductivity of at least 11 W/mK (e.g., 11 W/mK, 12 W/mK, higher than 12 W/mK, etc.). The thermally-conductive EMI absorber has an attenuation greater than 15 decibels per centimeter (dB/cm) at a frequency of 10 gigahertz (GHz) or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. The thermally-conductive EMI absorber has a hardness of about 68 Shore 00 or less at three seconds and a hardness of about 55 Shore 00 or less at thirty seconds. The thermally-conductive EMI absorber is dielectric and not electrically conductive. The thermally-conductive EMI absorber does not include silicone and is silicone free, such that the thermally-conductive EMI absorber is usable with no occurrence of silicone migration. The thermally-conductive EMI absorber is configured as a gap filler pad, a phase change material, a putty, a grease, or a sheet material.

In another exemplary embodiment, a thermally-conductive EMI absorber comprises a matrix and at least one functional filler in the matrix. In this example, the at least one functional filler includes or consists essentially of silicon carbide and aluminum oxide. And, the matrix includes or consists essentially of process oil, di-block polymer, coupling agent, antioxidant, and silica. Continuing with this example, the thermally-conductive EMI absorber includes at least 90% by weight (e.g., at least 94.5% by weight, etc.) of the at least one functional filler (silicon carbide and aluminum oxide) and no more than 6% by weight (e.g., no more than 5.5% by weight, etc.) of the matrix. Also, the thermally-conductive EMI absorber includes at least 80% by volume of the at least one functional filler (silicon carbide and aluminum oxide) and less than 20% by volume of the matrix. For example, the thermally-conductive EMI absorber may include about 69% to about 74% by weight of silicon carbide, about 20% to about 25% by weight of aluminum oxide, about 2.5% to about 5% by weight of process oil, about 0.3% to about 0.7% by weight of di-block polymer, about 0.2% to about 0.6% by weight of coupling agent, about 0.5% to about 0.9% by weight of silica, and less than about 0.1% by weight of antioxidant. The thermally-conductive EMI absorber has a thermal conductivity of at least 11 W/mK (e.g., 11 W/mK, 12 W/mK, higher than 12 W/mK, etc.). The thermally-conductive EMI absorber has an attenuation greater than 15 decibels per centimeter (dB/cm) at a frequency of 10 gigahertz (GHz) or higher, an attenuation greater than 34 dB/cm at a frequency of 20 GHz or higher, an attenuation greater than 66 dB/cm at a frequency of 40 GHz or higher, and an attenuation greater than 90 dB/cm at a frequency of 60 GHz or higher. The thermally-conductive EMI absorber has a hardness of about 58 Shore 00 or less at three seconds and a hardness of about 37 Shore 00 or less at thirty seconds. The thermally-conductive EMI absorber is dielectric and not electrically conductive. The thermally-conductive EMI absorber does not include silicone and is silicone free, such that the thermally-conductive EMI absorber is usable with no occurrence of silicone migration. The thermally-conductive EMI absorber is configured as a gap filler pad, a phase change material, a putty, a grease, or a sheet material.

By way of example, Tables 1 and 2 below includes example properties that thermally-conductive EMI absorbers may have in exemplary embodiments. As shown in Table 1 below, an exemplary embodiment of a thermally-conductive EMI absorber may have a thermal conductivity of at least about 12 Watts per meter-Kelvin (W/mK), a density of about 3 grams per cubic centimeter (g/cc), a hardness of about 58 Shore 00 or less at three seconds, a hardness of about 37 Shore 00 or less at thirty seconds, about 9.6% deflection at 38 kPa on a 1 mm thick sample, about 34.4% deflection at 345 kPa on a 1 mm thick sample, an operating temperature range from about −40° C. to about 125° C., etc.

As shown in Table 2 below, another exemplary embodiment of a thermally-conductive EMI absorber may have a thermal conductivity of at least about 11.5 W/mK, a density of about 2.96 g/cc, a hardness of about 58 Shore 00 or less at three seconds, a hardness of about 31 Shore 00 or less at thirty seconds, about 76% deflection at 10 pounds per square inch (psi) on a 1 mm thick sample, about 39% deflection at 50 psi on a 1 mm thick sample, an operating temperature range from about −40° C. to about 125° C., etc. In addition, the thermally-conductive EMI absorber may also be lead free, in compliance with REACH and ROHS, and have a UL flammability rating of UL V-0. As also shown in Table 2, the thermally-conductive EMI absorber may have the following electromagnetic properties: attenuation at 10 GHz of 22 dB/cm, attenuation at 20 GHz of 39 dB/cm, attenuation at 28 GHz of 53 dB/cm, attenuation at 39 GHz of 76 dB/cm, and attenuation at 77 GHz of 135 dB/cm.

The thermal conductivities disclosed in Tables 1 and 2 below and other thermal conductivities disclosed herein were determined by Hot Disk Thermal Constants Analyzer. In other exemplary embodiments, the thermally-conductive EMI absorber may be configured differently, e.g., have one or more different properties than what is provided in Table 1 and Table 2 (e.g., thermal conductivity of at least 6 W/mK, thermal conductivity of about 11 W/mK, etc.), etc.

TABLE 1

| PROPERTIES | DATA | TEST METHOD |
| --- | --- | --- |
| Color | Dark Grey | Visual |
| Thermal Conductivity | 12 W/mK | Hot Disk Thermal Constants Analyzer |
| Density g/cc | 3 | ASTM D792 |
| Hardness 3 seconds | 58 Shore 00 | ASTM D2240 |
| Hardness 30 seconds | 37 Shore 00 | ASTM D2240 |
| Deflection @ 138 kPa on 1 mm | 9.6% | ASTM D575 |
| Deflection @ 345 KPa on 1 mm | 34.4% | ASTM D575 |
| Temperature Range | −40° C. to 125° C. | N/A |
| Volume Resistivity | $6 \times 10^{13}$ Ω*cm | ASTM D257 |
| DC Breakdown voltage @ 2.5 mm | 1.3 kV | ASTM D149 |
| AC Breakdown voltage @ 2.5 mm | 1.6 kV | ASTM D149 |
| Standard Thickness Range | 0.5 mm to 5 mm | |
| Condensation and fogging at 120° C. | None over 96 hours | |

TABLE 2

| PROPERTIES | DATA | TEST METHOD |
| --- | --- | --- |
| Color | Dark Grey | Visual |
| Thermal Conductivity | 11.5 W/mK | Hot Disk Thermal Constants Analyzer |
| Density g/cc | 2.96 | ASTM D792 |
| Hardness 3 seconds | 58 Shore 00 | ASTM D2240 |
| Hardness 30 seconds | 31 Shore 00 | ASTM D2240 |
| Deflection @ 10 psi on 1 mm | 7% | ASTM D575 |
| Deflection @ 50 psi on 1 mm | 39% | ASTM D575 |
| Temperature Range | −40° C. to 125° C. | N/A |
| UL Flammability | UL94 V-0 | |
| Volume Resistivity | $6 \times 10^{16}$ Ω*cm | ASTM D257 |
| Outgas sing (TML) | 0.29% | ASTM E595-07 |
| Outgas sing (CVCM) | 0.14% | ASTM E595-07 |
| DC Breakdown voltage @ 2.5 mm | 1.85 kV | ASTM D149 |

TABLE 2-continued

| PROPERTIES | DATA | TEST METHOD |
|---|---|---|
| AC Breakdown voltage @ 2.5 mm | 1.34 kV | ASTM D149 |
| Standard Thickness Range | 0.5 mm to 4 mm | |
| Condensation and fogging at 120° C. | None over 96 hours | |
| Attenuation at 10 GHz | 22 dB/cm | |
| Attenuation at 20 GHz | 39 dB/cm | |
| Attenuation at 28 GHz | 53 dB/cm | |
| Attenuation at 39 GHz | 76 dB/cm | |
| Attenuation at 77 GHz | 135 dB/cm | |

In exemplary embodiments, the thermally-conductive EMI absorber may comprise a silicone free hybrid absorber/thermal management material with an ultra-high thermal conductivity of at least 11 W/mK (e.g., 11.5 W/mK, 12 W/mK, etc.). The thermally-conductive EMI absorber may be used similar to a traditional thermal interface material between a heat source (e.g., high-power integrated circuit (IC), optical transceiver, 5G infrastructure devices, etc.) and a heat dissipation/transfer device (e.g., heat sink, metal chassis, other heat removal structure, etc.). The thermally-conductive EMI absorber also functions to suppress unwanted energy coupling, resonances, or surface currents that may otherwise cause board level EMI issues.

Exemplary embodiments of the thermally-conductive EMI absorbers disclosed herein may include or provide one or more (but not necessarily any or all) of the following advantages or features, such as:
  very high thermal conductivity to meet industry trends of increasing IC power;
  good EMI suppression over a wide frequency range, e.g., over 25 GHz, over 60 GHz, etc.;
  silicone free formulation that is suitable for silicone sensitive applications;
  inherent surface tack;
  compliant with minimal or at least reduced component stress during assembly;
  space-saving solution and performance advantage from dual functional properties of thermal conductivity and EMI reduction;
  improved reliability performance of electronics, e.g., better signal integrity due to reduction of EMI, consistent performance of electronics due to temperature stability and low outgassing properties of product;
  improved electromagnetic compatibility (EMC) performance to meet compliance requirements;
  passes UL94 V-0 requirements; and
  environmentally friendly solution that meets regulatory requirements including RoHS and REACH.

In exemplary embodiments, the thermally-conductive EMI absorber provides a dual-purpose, single-product solution that may be used in wide range of industries and applications, such as applications involving ADAS (advanced driver-assistance systems) radar, high-speed data transmission, microwave transmission, satellite, space, cancer detection and treatment, wireless high-speed connections, 5G mmWave technology, SSR (split ring resonator) technology, optical transceivers, etc.

In exemplary embodiments, the thermally-conductive EMI absorber may be provided as a sheet that is 18 inches by 18 inches and that has thickness within a range from about 0.02 inches to about 0.16 inches or from about 0.5 mm to about 4 mm. For example, the thermally-conductive EMI absorber may be provided in a thickness of about 0.02 inches, 0.03 inches, 0.04 inches, 0.06 inches, 0.08 inches, etc.

In exemplary embodiments, a thermally-conductive EMI absorber may be used to define or provide part of a thermally-conductive heat path from a heat source to a heat removal/dissipation structure or component. The thermally-conductive EMI absorber may be used, for example, to help conduct thermal energy (e.g., heat, etc.) away from a heat source of an electronic device. The thermally-conductive EMI absorber may be positionable generally between (e.g., directly against in physical contact with, in thermal contact with, etc.) a heat source and a heat removal/dissipation structure or component to establish a thermal joint, interface, pathway, or thermally-conductive heat path along which heat may be transferred (e.g., conducted) from the heat source to the heat removal/dissipation structure or component. During operation, the thermally-conductive EMI absorber may function to allow transfer of heat (e.g., to conduct heat, etc.) from the heat source along the thermally-conductive path to the heat removal/dissipation structure or component. The thermally-conductive EMI absorber may also be operable for mitigating EMI (e.g., absorbing EMI, etc.) incident upon the thermally-conductive EMI absorber.

In an exemplary embodiment, an electronic device includes a heat source and a thermally-conductive EMI absorber as disclosed herein. The thermally-conductive EMI absorber is positioned relative to the heat source for establishing a thermally-conductive heat path from the heat source.

In an exemplary embodiment, an electronic device includes a heat source, a heat removal/dissipation structure, and a thermally-conductive EMI absorber as disclosed herein. The thermally-conductive EMI absorber is between the heat source and the heat removal/dissipation structure.

In an exemplary embodiment, an electronic device includes a heat source, an EMI shield, and a thermally-conductive EMI absorber as disclosed herein. The thermally-conductive EMI absorber is between the heat source and the EMI shield. The electronic device may further include a heat removal/dissipation device and a thermal interface material between the EMI shield and the heat removal/dissipation device. The heat source may be an integrated circuit. The EMI shield may be a board level shield. The heat removal/dissipation structure may be a heat sink The thermal interface material may be between the board level shield and the heat sink for establishing a thermally-conductive heat path from the board level shield to the heat sink. The thermally-conductive EMI absorber may be between the integrated circuit and the board level shield for establishing a thermally-conductive heat path from the integrated circuit to board level shield and for suppressing radiating electromagnetic fields coupling between the integrated circuit and the heat sink.

Example embodiments disclosed herein may be used with a wide range of heat sources, electronic devices, and/or heat removal/dissipation structures or components (e.g., a heat spreader, a heat sink, a heat pipe, a vapor chamber, a device exterior case, housing, or chassis, etc.). For example, a heat source may comprise one or more heat generating components or devices, such as a high-power integrated circuit (IC), optical transceiver, 5G infrastructure devices (e.g., base stations, small cells, smart poles, etc.), memory in video cards, set top boxes, televisions, gaming systems, automotive electronics used for autonomous driving (ADAS) (e.g., radars, multi domain controllers, cameras, etc.), a CPU, die within underfill, semiconductor device, flip chip device, graphics processing unit (GPU), digital signal processor (DSP), multiprocessor system, integrated circuit (IC), multi-core processor, etc.). Generally, a heat source may comprise any component or device that has a higher temperature than the thermally-conductive EMI absorber or otherwise provides or transfers heat to the thermally-conductive EMI absorber regardless of whether the heat is generated by the heat source or merely transferred through or via the heat source. Accordingly, aspects of the present disclosure should not be limited to use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", equivalents to the quantities are included.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermally-conductive electromagnetic interference (EMI) absorber comprising a matrix and at least one functional filler in the matrix, wherein:
    the thermally-conductive EMI absorber has a thermal conductivity greater than 6 Watts per meter per Kelvin (W/mK); and
    the thermally-conductive EMI absorber has an attenuation greater than 15 decibels per centimeter (dB/cm) at a frequency of 10 gigahertz (GHz) or higher; and
    wherein:
        the thermally-conductive EMI absorber includes at least 90% by weight of the at least one functional filler, and the thermally-conductive EMI absorber includes less than 10% by weight of the matrix; and/or
        the thermally-conductive EMI absorber includes at least 80% by volume of the at least one functional filler, and the thermally-conductive EMI absorber includes less than 20% by volume of the matrix.

2. The thermally-conductive EMI absorber of claim 1, wherein the thermally-conductive EMI absorber has a thermal conductivity of at least 11 W/mK.

3. The thermally-conductive EMI absorber of claim 1, wherein the thermally-conductive EMI absorber has a thermal conductivity of at least 11.5 W/mK.

4. The thermally-conductive EMI absorber of claim 1, wherein the thermally-conductive EMI absorber has a thermal conductivity of at least 12 W/mK.

5. The thermally-conductive EMI absorber of claim 1, wherein the thermally-conductive EMI absorber has:
    an attenuation greater than 34 dB/cm at a frequency of 20 GHz or higher;
    an attenuation greater than 66 dB/cm at a frequency of 40 GHz or higher; and
    an attenuation greater than 90 dB/cm at a frequency of 60 GHz or higher.

6. The thermally-conductive EMI absorber of claim 1, wherein the thermally-conductive EMI absorber has:
    an attenuation of at least 22 dB/cm at a frequency of 10 GHz;
    an attenuation of at least 39 dB/cm at a frequency of 20 GHz;
    an attenuation of at least 53 dB/cm at a frequency of 28 GHz;
    an attenuation of at least 76 dB/cm at a frequency of 39 GHz; and
    an attenuation of at least 135 dB/cm at a frequency of 77 GHz.

7. The thermally-conductive EMI absorber of claim 6, wherein the thermally-conductive EMI absorber has a thermal conductivity of at least 11.5 W/mK.

8. A thermally-conductive electromagnetic interference (EMI) absorber comprising a matrix and at least one functional filler in the matrix, wherein:
    the thermally-conductive EMI absorber has a thermal conductivity greater than 6 Watts per meter per Kelvin (W/mK);
    the thermally-conductive EMI absorber has an attenuation greater than 15 decibels per centimeter (dB/cm) at a frequency of 10 gigahertz (GHz) or higher;
    the thermally-conductive EMI absorber has a thermal conductivity of at least 11.5 W/mK;
    the thermally-conductive EMI absorber has a hardness of about 58 Shore 00 or less at three seconds and a hardness of about 37 Shore 00 or less at thirty seconds;
    the thermally-conductive EMI absorber has a UL flammability rating of UL V-0;
    the thermally-conductive EMI absorber is dielectric and not electrically conductive; and
    the thermally-conductive EMI absorber does not include silicone, is substantially entirely silicone free, and/or is usable with no occurrence of silicone migration; and
    wherein the thermally-conductive EMI absorber has:
        an attenuation of at least 22 dB/cm at a frequency of 10 GHz;
        an attenuation of at least 39 dB/cm at a frequency of 20 GHz;
        an attenuation of at least 53 dB/cm at a frequency of 28 GHz;
        an attenuation of at least 76 dB/cm at a frequency of 39 GHz; and
        an attenuation of at least 135 dB/cm at a frequency of 77 GHz.

9. The thermally-conductive EMI absorber of claim 1, wherein:
    the matrix comprises a thermally reversible oil gel; and/or
    the matrix comprises block copolymer and process oil;
    the matrix comprises di-block copolymer and/or tri-block copolymer.

10. The thermally-conductive EMI absorber of claim 1, wherein the matrix comprises process oil and block copolymers that are not chemically crosslinked such that the thermally-conductive EMI absorber is a thermally reversible thermoplastic material.

11. The thermally-conductive EMI absorber of claim 1, wherein the at least one functional filler comprises one or more of zinc oxide silicon carbide, carbonyl iron, aluminum oxide, aluminum nitride, aluminum, boron nitride, silicon nitride, iron, graphite, ferrite, alumina trihydrate, and/or silica.

12. The thermally-conductive EMI absorber of claim 1, wherein the at least one functional filler consists essentially of silicon carbide and aluminum oxide.

13. The thermally-conductive EMI absorber of claim 1, wherein the matrix comprises process oil, di-block polymer, coupling agent, and silica.

14. The thermally-conductive EMI absorber of claim 1, wherein the matrix comprises paraffinic process oil, styrene-ethylene-propylene (SEP) linear polymer with a di-block structure, and coupling agent.

15. The thermally-conductive EMI absorber of claim 1, wherein the matrix comprises a non-silicone polymer matrix.

16. The thermally-conductive EMI absorber of claim 15, wherein the non-silicone polymer matrix comprises a non-silicone oil gel resin, and/or wherein the non-silicone polymer matrix comprises:
   styrene and ethylene/butylene copolymers; and/or
   styrene and ethylene/propylene copolymers.

17. The thermally-conductive EMI absorber of claim 1, wherein:
   the matrix comprises process oil, di-block polymer, and coupling agent; and
   the at least one functional filler comprises silicon carbide.

18. The thermally-conductive EMI absorber of claim 17, wherein the at least one functional filler further comprises aluminum oxide.

19. A thermally-conductive electromagnetic interference (EMI) absorber comprising a matrix and at least one functional filler in the matrix, wherein:
   the thermally-conductive EMI absorber has a thermal conductivity greater than 6 Watts per meter per Kelvin (W/mK);
   the thermally-conductive EMI absorber has an attenuation greater than 15 decibels per centimeter (dB/cm) at a frequency of 10 gigahertz (GHz) or higher;
   the thermally-conductive EMI absorber has a UL flammability rating of UL V-0;
   the thermally-conductive EMI absorber is dielectric and not electrically conductive; and
   the thermally-conductive EMI absorber does not include silicone, is substantially entirely silicone free, and/or is usable with no occurrence of silicone migration.

20. The thermally-conductive EMI absorber of claim 19, wherein:
   the thermally-conductive EMI absorber includes at least 90% by weight of the at least one functional filler; and the thermally-conductive EMI absorber includes less than 10% by weight of the matrix; and/or
   the thermally-conductive EMI absorber includes at least 80% by volume of the at least one functional filler, and the thermally-conductive EMI absorber includes less than 20% by volume of the matrix.

21. A thermally-conductive electromagnetic interference (EMI) absorber comprising a matrix and at least one functional filler in the matrix, wherein:
   the thermally-conductive EMI absorber has a thermal conductivity greater than 6 Watts per meter per Kelvin (W/mK);
   the thermally-conductive EMI absorber has an attenuation greater than 15 decibels per centimeter (dB/cm) at a frequency of 10 gigahertz (GHz) or higher;
   the at least one functional filler includes silicon carbide and aluminum nitride;
   the matrix includes paraffinic process oil, styrene-ethylene-propylene (SEP) linear polymer with a di-block structure, and coupling agent;
   the thermally-conductive EMI absorber includes at least 93% by weight of the at least one functional filler and no more than 7% by weight of the matrix; and
   the thermally-conductive EMI absorber includes at least 81% by volume of the at least one functional filler and no more than 19% by volume of the matrix.

22. A thermally-conductive electromagnetic interference (EMI) absorber comprising a matrix and at least one functional filler in the matrix, wherein:
   the thermally-conductive EMI absorber has a thermal conductivity greater than 6 Watts per meter per Kelvin (W/mK);
   the thermally-conductive EMI absorber has an attenuation greater than 15 decibels per centimeter (dB/cm) at a frequency of 10 gigahertz (GHz) or higher;
   the at least one functional filler includes silicon carbide and aluminum oxide;
   the matrix includes process oil, di-block polymer, coupling agent, antioxidant, and silica;
   the thermally-conductive EMI absorber includes at least 94.5% by weight of the at least one functional filler and no more than 5.5% by weight of the matrix; and
   the thermally-conductive EMI absorber includes at least 80% by volume of the at least one functional filler and no more than 20% by volume of the matrix.

23. The thermally-conductive EMI absorber of claim 22, wherein the thermally-conductive EMI absorber includes about 69% to about 74% by weight of silicon carbide, about 20% to about 25% by weight of aluminum oxide, about 2.5% to about 5% by weight of process oil, about 0.3% to about 0.7% by weight of di-block polymer, about 0.2% to about 0.6% by weight of coupling agent, about 0.5% to about 0.9% by weight of silica, and less than about 0.1% by weight of antioxidant.

* * * * *